United States Patent [19]

Shimbo

[11] Patent Number: 4,601,097
[45] Date of Patent: Jul. 22, 1986

[54] METHOD OF PRODUCING THIN-FILM TRANSISTOR ARRAY

[75] Inventor: Masafumi Shimbo, Tokyo, Japan

[73] Assignee: Seiko Instruments & Electronics Ltd., Tokyo, Japan

[21] Appl. No.: 665,773

[22] Filed: Oct. 29, 1984

[30] Foreign Application Priority Data

Nov. 11, 1983 [JP] Japan .................. 58-211852

[51] Int. Cl.⁴ .............. H01L 29/78; G02F 1/133
[52] U.S. Cl. ........................ 29/572; 29/578; 29/580; 148/1.5; 357/4; 357/30; 357/84
[58] Field of Search ........... 29/571, 578, 572, 580, 29/591; 148/1.5; 427/82, 84; 357/23 TF, 4, 84, 30

[56] References Cited

U.S. PATENT DOCUMENTS

| | | | |
|---|---|---|---|
| 3,490,943 | 1/1970 | Werdt | 357/4 X |
| 4,065,781 | 12/1977 | Gutknecht | 357/4 X |
| 4,404,578 | 9/1983 | Takafuji et al. | 357/23.7 X |
| 4,412,234 | 10/1983 | Matsuda et al. | 357/84 X |
| 4,425,572 | 1/1984 | Takafuji et al. | 357/23.7 X |

FOREIGN PATENT DOCUMENTS 58-88779  5/1983  Japan .
58-88781  5/1983  Japan .
58-147069 9/1983  Japan .

Primary Examiner—Brian E. Hearn
Assistant Examiner—David A. Hey
Attorney, Agent, or Firm—Robert E. Burns; Emmanuel J. Lobato; Bruce L. Adams

[57] ABSTRACT

A method of manufacturing a thin film transistor array is simplified by processes to form source and drain electrodes at least of ITO film for pixel electrodes on a gate insulating film covering gate electrode and to form islands of an amorphous semiconductor film and a light shield film in the same masking process on the source and the drain electrodes.

7 Claims, 12 Drawing Figures

METHOD OF PRODUCING THIN-FILM TRANSISTOR ARRAY

BACKGROUND OF THE INVENTION

This invention relates to a method of producing an active matrix array using thin film transistors for a liquid-crystal display device.

Thin film transistors (TFT) using thin films of amorphous semiconductors such as amorphous silicon (a-Si) can have a large area and can be produced at low temperatures, and can be fabricated using inexpensive substrates such as glass. For these reasons, they are the most suitable for making inexpensive liquid-crystal devices of large areas. When used in a liquid-crystal display device, however, TFTs must be shielded from light because a-Si is sensitive to light which changes its resistivity. Shielding means must be provided not only for light incident from the front, but also for light incident from the rear when a transmission type of liquid-crystal display device is used, and hence the number of steps required to produce such a display increases. When shielding films are provided on the front and back of a TFT, for example, the production thereof requires the following seven masking steps:
(1) lower shielding film
(2) gate electrode wiring
(3) a-Si
(4) contacts
(5) source-drain metal electrode wiring
(6) upper shielding film
(7) formation of holes of the surface protective insulator film
In addition:
(8) display electrodes are necessary when this TFT is used in a liquid-crystal display device, and
(9) when a signal-holding capacitor is incorporated in each picture element, a masking step for the common electrodes is also necessary.

Thus the production of a TFT array needs eight or nine masking steps, so that the economy of using TFTs is compromised, and the increased number of production steps results in a drop in production yield.

SUMMARY OF THE INVENTION

It is an object of the present invention to provide a method of producing a TFT matrix array which has fewer masking steps than prior-art methods. Since the number of masking steps in accordance with the present invention is as little as four, the production cost is reduced and the production yield increased. The method of the present invention can reduce the number of masking steps by the following:
(1) the lower shielding film is also used as the gate electrode wiring, or they both have the same shape;
(2) at least part of the source-drain electrode wiring is made of the same material as the display electrodes;
(3) the upper shielding film and the a-Si have the same shape; and
(4) metal wiring is provided by lift-off using the contact masking step.

DETAILED DESCRIPTION OF PREFERRED EMBODIMENTS

Hereinafter, the present invention will be described in detail with reference to the accompanying drawings.

Figure 1A:
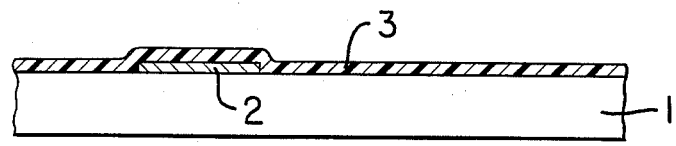
FIGS. 1a through 1e are sections through a picture element of a TFT illustrating steps in the production process in accordance with the present invention.

FIGS. 1a through 1e are sections through a picture element of a TFT matrix array in accordance with the production steps of the present invention. In FIG. 1a, after a gate electrode wiring 2 has been formed selectively on an insulating substrate 1 of a substance such as glass, quartz, ceramic or the like, a gate insulator film 3 is deposited over the entire surface. The gate electrode wiring 2 is made of a material which is opaque to light below the band-gap energy of a-Si (particularly visible light), such as Al, Cr, Mo, Ta, W, etc., or silicides of these metals, and the material has a thickness which provides a transmissivity of less than $10^{-3}$. A thin film of a semiconductor such as a-Si to which Ge or Sn is added, and which has a band gap less than that of a-Si, can also be used as well as these metals.

The gate insulator film 3 is formed by a method which can deposit the film at a low temperature, such as plasma CVD (PCVD), evaporation, sputtering, and optical CVC, so that an Si oxide film, an Si nitride film, an Al oxide film, or a mixed film thereof, is deposited thereby. An oxide of the metal of the gate electrode wiring 2 can also be used. The material and thickness of the gate insulator film 3 are determined by the characteristics of the desired TFT. With an Si oxide film, for example, a typical thickness is between 500 Å to 3,000 Å.

Figure 1B:
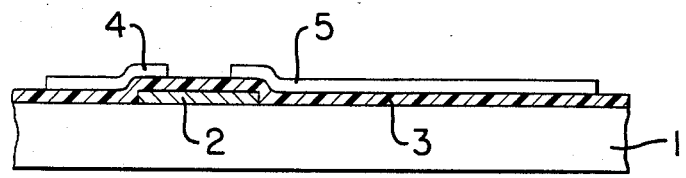

FIG. 1b shows the element after a source electrode wiring 4 and a drain electrode 5, which will also act as a display electrode, are formed. A film of a conductor which is transparent to visible light is used for these electrodes 4 and 5, a suitable example thereof being indium tin oxide (ITO) or tin oxide. When the display electrode need not be particularly transparent, a metallic material could be used. The source and drain electrodes 4 and 5 can be formed by ordinary masking steps and selective etching, but a lift-off method is preferable because it does not damage the gate insulator film 3. In order to reduce the gate-source capacitance and the gate-drain capacitance, the overlapped areas of the gate electrode wiring 2 and the source and drain electrodes 4 and 5 can be minimized by exposing the substrate 1 to light from behind, using the gate electrode wiring 2 as a mask. This is effective when a transparent substrate 1 and source-drain electrodes 4, 5 of a transparent conductive film are employed.

Figure 1C:
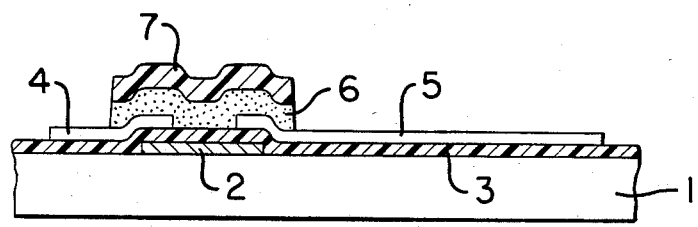
Figure 1D:
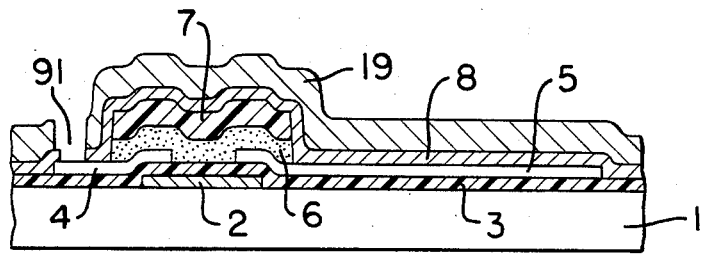

FIG. 1c shows the element after island of an a-Si film 6 and a light-shielding film 7 have been deposited in sequence and left in desired shapes. The amorphous silicon (a-Si) is deposited by PCVD or optical CVD, and hydrogen or fluorine is added thereto. In FIG. 1d, contact windows 91 for leading out the source wiring and gate wiring (the contact window for the gate wiring 2 is omitted) are opened using resist 19 as a mask, after a surface protective film 8 has been deposited, if necessary. The surface protective film 8 is made of the same material as that of the gate insulator film 3, using the same deposition method, but a coating of a polymide resin, for example, could also be used.

Figure 1E:
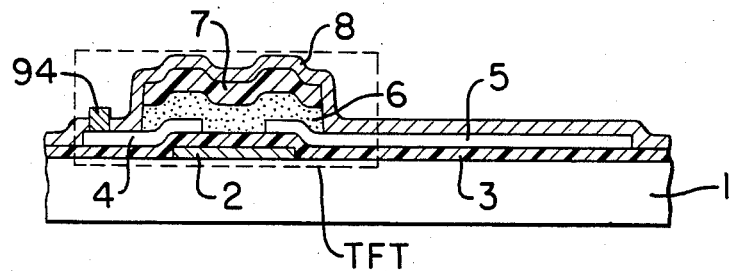

FIG. 1e shows the completed element in which part of the source and gate wiring, and other wiring if necessary, is selectively formed by metallic films. Metallic wiring 94 is shown here formed on the source electrode 4 within the contact window 91. The metallic wiring comprises a lead-out electrode and can be formed by the ordinary deposition of a metallic film, a mask step, and selective etching. It is also possible to employ lift-off by, for example, depositing a metallic film over the element of FIG. 1d and then removing the resist 19. This can reduce the number of masking steps. When lift-off is used, it is preferable to over-etch the surface protective film 8 (including the gate insulator film 3 if necessary) when the contact window 91 of FIG. 1d is opened up. This makes the step easier. Additionally, when lift-off is used, the contact window hole portion in the step of FIG. 1d can be provided not only on the source electrode wiring 4, but also on the substrate 1, because the substrate 1 is made of an insulating material, so that the metallic film can be patterned to any shape.

As described above, the present invention makes it possible to complete a TFT matrix array having gate electrode wirings as row lines and source electrode wirings as column lines with a minimum of four masking steps. It is therefore obvious that the production cost can be reduced to approximately half of that of the prior art. Another advantage of the present invention is that a high conversion transconductance can be obtained because there are no resistances between the channel and the source and drain electrodes of the TFT as can be appreciated from FIG. 1e.

Figure 2A:
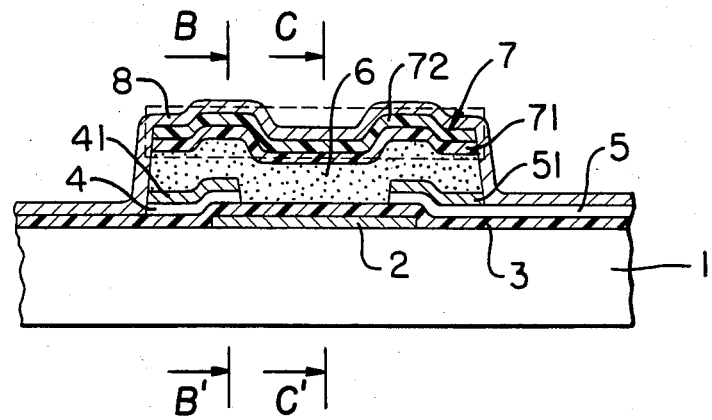
FIGS. 2a through 2c are sections through a unit picture element in accordance with another embodiment of the present invention, with FIGS. 2b and 2c being partial sections taken along the lines B—B' and C—C' of FIG. 2a, respectively.
Figures 2B, 2C:
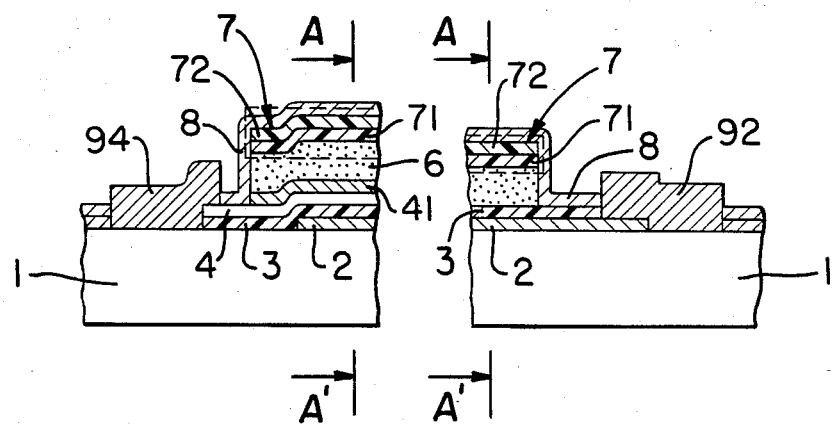

FIGS. 2a through 2c are sections through the structures of a picture element to which the production method in accordance with another embodiment of the invention is applied. FIGS. 2b and 2c are partial sections taken along the lines B—B' and C—C' of FIG. 2a, respectively. The source electrode wiring 4 and the drain electrode 5 are additionally provided with opaque conductive films 41 and 51 (e.g., a-Si to which a metal or other impurity is added, or a layer thereof). These opaque conductive films 41 and 51 are deposited after the deposition of the source and drain electrodes 4 and 5, and are patterned to the same shape. The display portion of the drain electrode 4 and the opaque conductive films on the lead-out portion of the source electrode wiring 3 are removed after selective etching of the a-Si film 6. In this embodiment, the upper light-shielding film 7 consists of two layers, an insulator film 71 and an opaque conductive film 72.

The lead-out electrode 94 for the source electrode wiring 4 (e.g. a bonding pad) is formed by a selective etching and lift-off of the surface protective film 8 partially overlapping the source electrode wiring 4 outside the TFT, and the gate insulator film 3. The external lead-out electrode 92 for the gate electrode wiring 2 is formed in the same way. These lead-out electrodes 92 and 94 can not only be used for extending the wires to the outside, but also for reducing the resistance of the source and gate electrode wiring 4 and 2.

In accordance with the structure shown in FIG. 2, it is possible to use an opaque conductive film such as a metal as the light-shielding film 7, but of course it is also possible to use an opaque high-resistance film (e.g., a-Si to which Ge is added) or an insulator film. In the latter case, the insulator film 71 will not always be necessary.

Figure 3A:
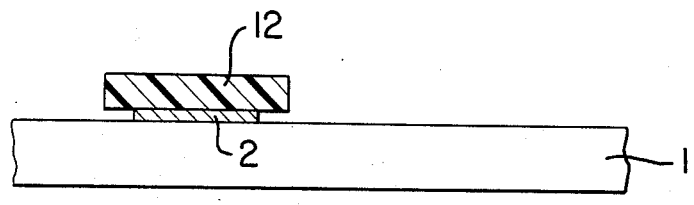
FIGS. 3a through 3d are sections through an element illustrating steps in the production process in accordance with still another embodiment of the present invention.
Figure 3B:
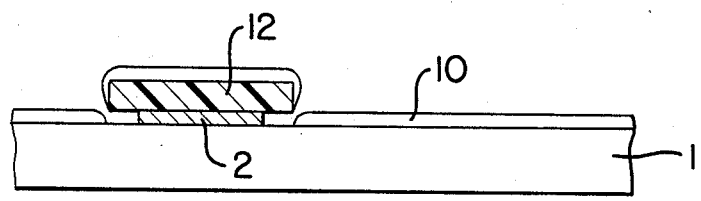
Figure 3C:
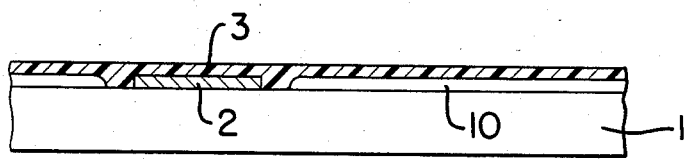
Figure 3D:
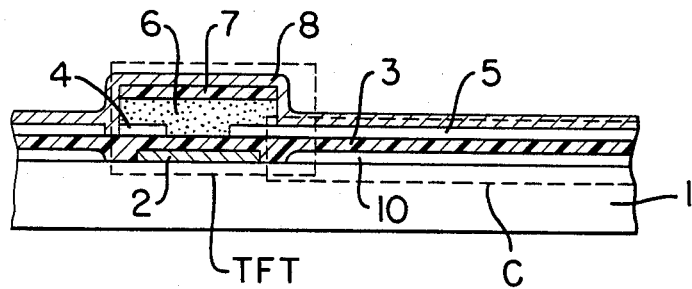

FIGS. 3a through 3d are sections through a picture element illustrating the production steps when a signal voltage-holding capacitor c is formed. In FIG. 3a, the gate electrode wiring 2 is selectively formed on the substrate 1 using resist 12 as a mask. In this case, the gate electrode wiring 2 is overetched, and hence the resist 12 is undercut. In FIG. 3b, a conductive film which acts as a common electrode 10 is deposited over the element of FIG. 3a. When a transmission type of display is to be formed, this common electrode 10 is transparent. In FIG. 3c, after the common electrode 10 has been patterned by lift-off, the gate insulator film 3 is deposited. FIG. 3d shows the element after the TFT and the display electrode have been formed in the same way as in the embodiments of FIGS. 1 and 2.

To provide a signal voltage-holding capacitor c, it is necessary conventionally to add one masking step to form the common electrode 10, but in accordance with the present invention, no additional masking step is necessary because of the utilization of lift-off. However, the resist 12 must be undercut by at least 1 $\mu$m, preferably about 5 $\mu$m, when the gate electrode wiring 2 is side-etched (FIG. 3a).

As can be understood clearly from the foregoing, the method according to producing a TFT array of the present invention can produce a product with a minimum of four masking steps, and can also reduce the number of etching steps because it utilizes lift-off.

Although the present invention has been described primarily with reference to a TFT in which a-Si is used, it can also be applied to TFTs in which other amorphous films or crystal-line thin films obtained by beam-annealing such films by lasers, lamps, or electron rays. It is also obvious that the TFTs and production methods illustrated in the foregoing embodiments can be used not only for picture elements, but also for peripheral circuits.

I claim:

1. A method of producing a thin-film transistor array comprising:
    a first step of selectively forming gate electrode wirings as row lines made of a first opaque conductive film on an insulating substrate;
    a second step of depositing a gate insulator film over said gate electrode wirings and said substrate;
    a third step of, after depositing at least a first transparent conductive film, selectively forming source electrode wirings as column lines on said gate insulator film and selectively forming drain electrodes at intersecting portions of said gate and source electrode wirings on said gate insulator film and spaced apart from said source electrode wirings, said source electrode wirings and drain electrodes having overlapping portions relative to said gate electrode wirings;
    a fourth step of depositing an amorphous semiconductor thin film on said source electrode wirings, drain electrodes and gate insulator film;
    a fifth step of depositing a light-shielding film on said semiconductor thin film;
    a sixth step of selectively forming islands of said semiconductor thin film and said light-shielding film in the same shape so that each island has said semiconductor thin film at least in contact with a portion of said source electrode wiring, a portion of said drain electrode and a portion of said gate insulator film which is deposited over a portion of said gate electrode wiring;

a seventh step of forming contact windows in said gate insulator film at least to expose portions of said gate electrode wirings; and an eighth step of selectively forming at least gate lead-out electrodes of a metal film through said contact windows and source lead-out electrodes of a metal film on portions of said source electrode wirings.

2. The method of producing a thin-film transistor array as claimed in claim 1; wherein, in said third step, a second opaque conductive film is deposited over said first transparent conductive film and both films are selectively etched to form said source electrode wirings and said drain electrodes; and in said sixth step, exposed portions of said second opaque conductive film after forming islands of said semiconductor thin film and said light-shielding film are removed to make said drain electrodes partially transparent.

3. The method of producing a thin-film transistor array as claimed in claim 2; wherein, an insulator film is deposited over said islands, said gate insulator film, said source electrode wirings and said drain electrodes after said sixth step; said insulator film and/or said gate insulator film are selectively etched in said seventh step to form contact windows by exposing at least portions of said gate electrode wirings and said source electrode wirings using a second resist as a mask; and said gate lead-out electrodes and said source lead-out electrodes are selectively formed in said eighth step by removing said second resist after the deposition of said metal film.

4. The method of producing a thin-film transistor array as claimed in claim 1; wherein, an insulator film is deposited over said islands, said gate insulator film said source electrode wirings and said drain electrodes after said sixth step; and insulator film and/or said gate insulator film are selectively etched in said seventh step to form contact windows by exposing at least portions of said gate electrode wirings and said source electrode wirings using a second resist as a mask; and said gate lead-out electrodes and said source lead-out electrodes are selectively formed in said eighth step by removing said second resist after the deposition of said metal film.

5. A method of producing a thin-film transistor array comprising:

a first step of selectively forming gate electrode wirings as row lines by over-etching of a first opaque conductive film deposited on an insulating substrate using a first resist as a mask, and selectively forming a common electrode by depositing a second transparent conductive film on the first resist and on said substrate and thereafter removing said first resist to expose said gate electrode wirings;

a second step of depositing a gate insulator film over said gate electrode wirings, said common electrode and said substrate;

a third step of, after depositing at least a first transparent conductive film, selectively forming source electrode wirings as column lines on said gate insulator film and selectively forming drain electrodes at intersecting portions of said gate and source electrode wirings on said gate insulator film and spaced apart from said source electrode wirings, said source electrode wirings and drain electrodes having overlapping portions relative to said gate electrode wirings, and said drain electrodes also having overlapping portions relative to said common electrode with said gate insulating film interposed therebetween to form capacitors;

a fourth step of depositing an amorphous semiconductor thin film on said source electrode wirings, drain electrodes and gate insulator film;

a fifth step of depositing a light-shielding film on said semiconductor thin film;

a sixth step of selectively forming islands of said semiconductor thin film and said light-shielding film in the same shape so that each island has said semiconductors thin film as least in contact with a portion of said source electrode wiring, a portion of said drain electrode and a portion of said gate insulator film which is deposited over a portion of said gate electrode wiring;

a seventh step of forming contact windows in said gate insulator film at least to expose portions of said gate electrode wirings; and an eighth step of selectively forming at least gate lead-out electrodes of a metal film through said contact windows and source lead-out electrodes of a metal film on portions of said source electrode wirings.

6. The method of producing a thin-film transistor array as claim in claim 5; wherein, in said third step, a second opaque conductive film is deposited over said first transparent conductive film and both films are selectively etched to form said source electrode wirings and said drain electrodes; and in said sixth step, exposed portions of said second opaque conductive film after forming islands of said semiconductor thin film and said light-shielding film are removed to make said drain electrodes partially transparent.

7. The method of producing a thin-film transistor array as claimed in claim 5; wherein, an insulator film is deposited over said islands, said gate insulator film, said source electrode wirings and said drain electrodes after said sixth step; said insulator film and/or said gate insulator film are selectively etched in said seventh step to form contact windows by exposing at least portions of said gate electrode wirings and said source electrode wirings using a second resist as a mask; and said gate lead-out electrodes and said source lead-out electrodes are selectively formed in said eighth step by removing said second resist after the deposition of said metal film.

* * * * *